United States Patent [19]

Belt et al.

[11] Patent Number: 4,954,211

[45] Date of Patent: Sep. 4, 1990

[54] MONOCRYSTALLINE LANTHANUM ORTHOGALLATE LASER MATERIAL

[75] Inventors: Roger F. Belt, Morristown; Robert Uhrin, Brookside, both of N.J.

[73] Assignee: Litton Systems, Inc., Morristown, N.J.

[21] Appl. No.: 164,110

[22] Filed: Mar. 4, 1988

[51] Int. Cl.$^5$ .................... C04B 35/48; C01F 11/02
[52] U.S. Cl. ................... 156/617.1; 156/610; 156/DIG. 80; 252/518; 252/519; 372/41
[58] Field of Search ............ 156/610, 617.1, DIG. 80; 252/518, 521; 372/41

[56] References Cited

U.S. PATENT DOCUMENTS 3,283,164  11/1966  Remeika .................... 372/41

FOREIGN PATENT DOCUMENTS 266751  2/1973  U.S.S.R.

OTHER PUBLICATIONS

Sandstrom et al, Appl. Phys. Lett. 53 (1988), 1874.
E. J. Baran–Infrared Spectrum of LaGaO$_3$; 1975; pp. 3572–3575.
Naturforsch; National University of LaPlata, Argentina pp. 136–137.
J. Yang, et. al–On the Luminescence of Perovskite Type Rare Earth Gallates; 1985; New Front. Rare Earth Sci. vol. 2, pp. 860–863.
G. Sallavuard et. al–Lanthanide Monogallates; Mar. 1969, C. R. Academy of Sciences, Paris; pp. 1050–1053.
M. Mizuno et. al—Phase Diagram of the System Gallium Trioxide–Lanthanum Oxide at High Temps.; Gov't. Industrial Research Institute, 1985; pp. 295–300.
D. Lefebvre et al–Substituted Lanthanum Hexagallates a Substrates; Materials Research Bulletin, vol. 22; pp. 1039–1045 (1987).
G. F. Ruse et. al–Growth of Neodymium Gallium Oxide Crystals; Journal of Crystal Growth 29 (1975) pp. 305–308.

*Primary Examiner*—Upendra Roy
*Attorney, Agent, or Firm*—Michael H. Wallach; Robert F. Rotella

[57] ABSTRACT

Doped lanthanum orthogallate laser materials produced in the form of large perovskite-type doped single crystals are disclosed. Doped single crystals of lanthanum orthogallate are grown from a pure melt of lanthanum oxide, gallium oxide and dopant oxide while controlling the major crystallographic direction of solidification. Dopants are selected from the rare earth series elements, first transition series elements and actinide series elements.

71 Claims, No Drawings

MONOCRYSTALLINE LANTHANUM ORTHOGALLATE LASER MATERIAL

BACKGROUND OF THE INVENTION

I. Field of the Invention

This application is related to patent application Serial Nos. 07/164,235 and 07/164,101 each of which were filed on the same date as this application and which are owned by the assignee of this application.

This invention relates to the field of laser materials, in particular the invention involves doped lanthanum orthogallate laser materials produced in the form of large perovskite-type doped single crystals. Specifically, the invention relates to the discovery that doped single-crystals of lanthanum orthogallate may be grown from a pure melt of lanthanum oxide, gallium oxide and dopant oxide while controlling the major crystallographic direction of solidification.

II. Description of the Prior Art

The mineral perovskite ($CaTiO_3$) serves as a prototype crystal structure for a large class of compounds of general formula $ABO_3$. In this structure, the A element is a large cation while the B element is a smaller cation. In order to maintain charge neutrality in the compound, the sum of the cation valence states should total six. Thus, various combinations of A and B valence states are possible, e.g. 3-3, 2-4, 1-5and even mixed fractional compositions. The ideal perovskite crystal structure is cubic where 8(A)ions are located at the cube corners, 6(O)ions at the cube faces and a single B ion at the cube center. In a practical situation, most perovskite structures are distorted from cubic to tetragonal, rhombohederal, or orthorhombic crystal forms. The perovskite structure is likely to be generated where A cations are coordinated with 12 oxygen ions and B cations with 6 oxygen. It was shown first by V. M. Goldschmidt in Skrifter Norske Videnskops—Akad, Oslo, I, Mat.—Naturv. Kl., No. 8 (1926) that a cubic perovskite is stable only if a tolerance factor has an approximate range of $0.8 < t < 0.9$. Here t is defined by $R_A$ & $R_O = t\sqrt{2} (R_B + R_O)$ where $R_A$, $R_B$, and $R_O$ are ionic radii of the A, B, and O ions respectively. For distorted structures, t may have a larger tolerance. The perovskite structure is very important as a basis for semiconductors, thermoelectrics, ferroelectrics, laser hosts, catalysts, and ferromagnetic materials. A modern discussion of these applications is given in the book "Structure, Properties, and Preparation of Perovskite—Type Compounds " by F. S. Galasso, Pergamon Press, New York, 1969. The perovskite related high Tc superconductor oxides of type $La_{1.85}Ba_{0.15}CuO_{4-x}$ and $YBa_2Cu_3O_{7-x}$, which were discovered in 1987, have again brought this structure into technical prominence. $ABO_3$ compounds other than $CaTiO_3$ (perovskite) which possess the perovskite crystal structure are alternatively referred to as "perovskite-type", "perovskite-like" or "perovskite-related". As used herein when referring to compositions other than $CaTiO_3$, the term "perovskite" describes the crystalline structure of such compositions.

The compound $LaGaO_3$ was prepared first as a polycrystalline powder, characterized, and reported as a perovskite-like structure by S. Geller, in Acta Cryst. 10, 243 (1957). Geller determined by X-ray diffraction, the structure at room temperature to be an orthorhombic crystal with the following unit cell dimensions: $a = 5.496$ A, $b = 5.524$ A, and $C = 7.787$ A. Small single crystals, ca, 1–5 mm in size, were grown from a $PbO$—$B_2O_3$ flux as reported by M. Marezio, J. P. Remeika and P. D. Dernier in Inorganic Chemistry 7, 1337 (1968). These workers again determined the crystals to be orthorhombic with the following lattice constants: $a = 5.526$ A $b = 5.473$ A and $c = 7.767$ A. Several years later a reinvestigation of the $La_2O_3$—$Ga_2O_3$ system by solid state reaction showed a similar result for $LaGaO_3$. See S. Geller, P. J. Curlander and G. F. Ruse in Mat. Res. Bull. 9, 637 (1974) Geller reported measurement of the orthorhombic unit cell as follows: $a = 5.519$ A, $b = 5.494$ A, and $c = 7.770$ A.

The phase diagram of the $La_2O_3$—$Ga_2O_3$ system was studied in a preliminary fashion by S. J. Shchneider, R. S. Roth and J. L. Waring, J. Research Natl, Bur. Standards 65A [4]365 (1961). Schneider et al. found that the perovskite phase existed at the stoichiometric 1:1 composition. However, it was not indicated whether this composition or those adjacent within a few mole percent were either congruently or incongruently melting. Generally mixtures of a high melting component ($La_2O_3$) with a partially volatile low melting component such as $Ga_2O_3$ are difficult to control compositionally at or near the melting point of the stoichiometric mix. The prior art has not recognized that boules capable of providing doped lanthanum orthogallate of predetermined orientation could be readily grown from pure melts.

Doped lanthanum orthogallate has not heretofore been used as a laser material.

III. Invention Contrasted From the Prior Art

In accordance with the present invention, it has unexpectedly been found contrary to what is suggested by previous investigators that powdered stoichiometric mixtures of $La_2O_3$ and $Ga_2O_3$ at the 1:1 $Ga_2O_3$ composition melt stably and apparently congruently with little or no evolution of $Ga_2O_3$; that the resulting stable melts of about 1:1 composition are low melting, circa 1675° C. by uncorrected pyrometer, a temperature near the $Ga_2O_3$ melting point; that such pure melts can be formed and retained in iridium crucibles for sufficient time to practice the Czochralski method of growth; that such melts can be seeded by an iridium wire to obtain a single perovskite-type crystal near a preferred [110] orientation; that seeded growth via oriented single crystals can produce large boules in [110] orientation or other favorable orientations, viz. [100], [010], or [001]; that powdered mixtures of $La_2O_3$, $Ga_2O_3$ and oxides of impurity ions that function as laser activators also provide single perovskite-type crystals; and, that seeded growth using oriented single crystals can produce large boules of doped lanthanum orthogallate single crystals equivalent in size to those of lanthanum orthogallate single crystals, such doped lanthanum orthogallate single crystals particularly adapted for laser rod formation.

SUMMARY OF THE INVENTION

It is an object of the present invention to provide an easily manufactured high optical quality laser material. It has been found in accordance with the present invention that monocrystalline lanthanum orthogallate, doped with an impurity ion that functions as a laser activator, and grown along a predetermined crystallographic direction is readily grown from a uniform melt of lanthanum, gallium and dopant oxides. Impurity ions that function as laser activators may be selected from the rare earth series elements, the first transition series elements or the actinide series elements or mixtures thereof. Suitable rare earth series elements are Nd, Er, Tm, Ho, Tb, Pr and mixtures thereof, with Nd being most preferred. The preferred first transition series elements are trivalent Cr, trivalent Ti and mixtures thereof; trivalent uranium is also among the preferred lasing ions. The rare earth series impurity ions which function as laser activators in the crystal may be present in a ratio relative to lanthanum ions in the range of from about 1:0 to about 1:500. Preferably the ratio of rare earth series impurity ions to lanthanum ions in the crystal is in the range of from about 1:50 to about 1:200.

In the embodiment of the invention where trivalent Cr, Ti, and/or U are present, alone or in combination, the trivalent transition elements (in toto) may be present in a ratio of transition element(s) relative to gallium ions of from 1:500 to 1:10. Preferably, the ratio of transition element(s) to gallium ions is in the range of from about 1:200 to about 1:50.

A specific embodiment of the invention relates to monocrystalline lanthanum orthogallate wherein the dopant is Nd. In this embodiment of the invention the Nd:La ratio in said crystal may be from 1:0 to 1:500. Most preferably in this embodiment of the invention the Nd:La ratio is from about 1:50 to about 1:200.

Laser rods composed of doped monocrystalline lanthanum orthogallate, in accordance with the present invention, are characterized by favorable optical qualities including a wavefront distortion $<\frac{1}{8}\lambda$ per cm length at lasing wavelength ($\lambda$) and an optical loss $<0.005$ per cm length.

Also in accordance with the present invention, doped monocrystalline lanthanum orthogallate material is fabricated into laser rods. Crystal orientations of [001], [010] or [100] are preferred and crystal orientations of [010] or [001] are most preferred.

The doped monocrystalline lanthanum orthogallate preferably is in the form of a single crystal of a size exceeding 1 cm in diameter/width and at least 10 cm in length and suitable for fabrication of a larger rod.

Another respect of the present invention relates to a method of growing a doped monocrystalline lanthanum orthogallate along a predetermined crystallographic direction. The method comprises the steps of forming a mixture of $La_2O_3$, $Ga_2O_3$ and an oxide of the dopant ion; heating said mixture to form a melt of uniform composition in a controlled atmosphere; and, cooling said melt to form said doped monocrystalline lanthanum orthogallate. Preferably the mixture of $La_2O_3$, $Ga_2O_3$ dopant oxide is stoichiometric.

The amounts of ingredients in the stoichiometric mixture can vary from the exact stoichiometric quantities calculated from the doped monocrystalline product. Variations of up to about $\pm 5$ percent can be tolerated without adversely affecting the desired oriented single crystalline product. Thus for purposes of calculating stoichiometric ratio variations of $\pm 2$ percent can be tolerated.

Yet another aspect of the present invention involves growing doped monocrystalline lanthanum orthogallate by the Czochralski method. This method comprises the steps of forming a mixture of $La_2O_3$, $Ga_2O_3$ and dopant oxide preferably in stoichiometric amounts; heating said mixture to form a melt of uniform composition in a controlled atmosphere; initiating growth of said crystal on nucleating means for holding and pulling said crystal from the melt; and pulling the crystal formed on the nucleating means. The nucleating means is preferably an oriented seed crystal, although in accordance with the present invention the nucleating means may be an inert material stable at the temperature of the melt, e.g. iridium.

DETAILED DESCRIPTION OF THE INVENTION

The purity of the oxides that are mixed to form the melt suitably is at least about 99.9%. Oxide purity of about 99.99% or greater is preferably used. In accordance with the present invention boules of a size of about 0.7 inch diameter or greater and 4 inch in length or larger are obtained and sizes of 1 inch or greater diameter and 5-6 inches in length or even larger are capable of being grown using a pure melt. In accordance with the present invention, doped monocrystalline lanthanum orthogallate may be formed using a pure melt (a melt consisting essentially of $La_2O_3$, $Ga_2O_3$ and dopant oxide) in sizes of at least one centimeter in diameter and 10 cm. in length. A substantially stoichiometric ratio of $La_2O_3$, $Ga_2O_3$ and dopant oxide is used to form a uniform pure melt for the dopant monocrystalline lanthanum gallate of the present invention.

It is possible to obtain a monocrystalline product utilizing admixtures of lanthanum, gallium and dopant oxides outside the stoichiometric ratios required for doped lanthanum orthogallate formation but not necessarily with the same results; that is, variations in the refractive index and crystal quality may occur.

The doped crystal is suitably formed at atmospheric conditions that are inert, oxidizing or reducing. The stability of the melt is such that it is possible to use inert atmospheric conditions. The use of an oxidizing atmosphere to suppress reduction of gallium oxide component of the mix is preferred. It should also be pointed out that the type of atmosphere used varies in accordance with the method of manufacture of the monocrystalline materials of the present invention and the dopants selected. Where doped lanthanum orthogallate is made by introduction of trivalent uranium ($U^{3+}$) and titanium ($Ti^{3+}$) cations, it may be advantageous to grow the doped lanthanum orthogallate crystal in a reducing atmosphere.

Growth of monocrystalline lanthanum orthogallate can be in the [001], [010] or [100] orientations or in alternate orientations.

To form the laser material of the present invention, any trivalent lasing ion of the rare earth series (La to Lu) or the actinide series (U to Lr) may be substituted for the $La^{3+}$ in significant amounts. In the rare earth series, La, Gd and Lu are not lasing ions; however, the remaining elements of the series are all capable of acting as laser activators in accordance with the present invention, though not necessarily with the same result. Furthermore, the large size of the $La^{3+}$ determines a favorable distribution coefficient, k, (where k is close to unity), for incorporating impurity ions of the foregoing type. For tunable lasers, the trivalent ions of the transition elements, e.g., $Cr^{3+}$ or $Ti^{3+}$, can be substituted in the octahedral $Ga^{3+}$ sites in $LaGaO_3$. Lasers employing an energy transfer, e.g. $Cr^{3+}$ to $Nd^{3+}$ or several rare earths such as Er, Tm, Ho, may also be constructed with $LaGaO_3$. The most useful growth directions of doped monocrystalline $LaGaO_3$ are [010] and [001] with significant differences in threshold, gain, polarization, and other active lasing parameters.

The doped crystal laser rods of the present invention have a wavefront distortion $<\frac{1}{8}\lambda$ per cm. length at lasing wavelength of 1.064 μm and an optical loss <0.005 per cm. length. Laser rod sizes generally are larger than about 3 mm in width/diameter and 25 mm in length for laser applications involving 10-100 mW outputs. Generally for applications involving 100-500 mW outputs larger rods sizes are suitable such as (7×75), (10×100) or (15×125) mm.

EXAMPLE I

(Growth of LaGaO$_3$)

A single crystal of lanthanum orthogallate (LaGaO$_3$) was grown in a furnace arrangement consisting of a 2×2 inch cylindrical iridium crucible supported by a zirconia tube and entirely surrounded by zirconia grog for thermal insulation. Additional insulation for the growing crystal was provided by a 3×3 inch cylindrical zirconia sleeve situated above and concentric to the crucible. The component oxides are purchased as free flowing microcrystalline solid powders in a size range of approximately 1-10 μm. Power for melting the oxides and maintaining the crystal diameter was provided by a 350 K Hz induction generator supplying a 10 turn coil located external to a quartz tube which held the ceramic elements and crucible in place. The growth furnace was isolated from the ambient atmosphere by means of a water cooled metal enclosure.

A melt comprised of lanthanum orthogallate was established by introducing a stoichiometric mixture of 330.2 g of 99.99% purity lanthanum oxide and 189.8 g of 99.99% purity oxide into the iridium crucible. Power to the crucible was increased until the contents were completely molten. In the absence of a lanthanum orthogallate seed, an iridium wire was then located into the melt in order to nucleate a crystal. Following initial crystallization, the wire was withdrawn at 1.25 mm per hour while rotating at 25 rpm. The entire melting and crystal growth procedure was conducted in a controlled atmosphere comprised of 99.5% N$_2$ flowing at 21 liter/minute and 0.5% CO$_2$ flowing at 0.1 liter/minute.

An oxidizing atmosphere was chosen to counteract the anticipated loss of gallium oxide through volatilization. Loss by this mechanism was found to be negligible, however. In addition, the melting point was found to be much lower than expected. The temperature of the melt was approximately 1650° C.

The lanthanum orthogallate, as observed, congruently melted at or very near its stoichiometric composition. X-ray powder diffraction confirmed that the crystallized phase was lanthanum orthogallate.

The size of the grown crystal was 22 mm diameter ×84 mm long, and its single crystal nature was confirmed by the appearance of well-defined spots in a Laue back reflection x-ray photograph. The axial orientation of the crystal was close to [110].

EXAMPLE II

(Growth of LaGaO$_3$)

After the growth of the initial crystal, where a substantial portion (37%) of the melt was crystallized and removed, a second crystal was grown under the same conditions as before. Oxide components equal to the composition of the grown crystal, i.e. 121.9 g of La$_2$O$_3$ and 70.1 g of Ga$_2$O$_3$, were intimately mixed and added to the crucible containing the residual solidified melt. The component oxides are purchased as free flowing microcrystalline solid powders in a size range of approximately 1-10 μm. The temperature of the growth station was increased until the entire crucible contents had melted. An iridium wire was then lowered into the melt and crystallization was conducted as before. The previous observations of a relatively low melting point and good melt stability were replicated. A substantial portion (36%) of the melt was again crystallized with no indication of changes in the crystallized phase associated with a deviating melt composition.

The crystal measured 19 mm in diameter and 102 mm in length and was confirmed to be a single crystal of [001] orientation by Laue x-ray back reflection.

An x-ray powder pattern confirmed the LaGaO$_3$ composition and lattice constants.

The above procedure of melt addition and regrowth is normally not attainable in other Ga$_2$O$_3$ containing systems, e.g. Gd$_3$Ga$_5$O$_{12}$, because of substantial deviations in composition brought about by Ga$_2$O$_3$ volatility.

EXAMPLE III

(Growth of Doped Lanthanum Gallate)

A single crystal of lanthanum orthogallate doped with 1 atomic percent neodymium was grown using a growth furnace arrangement similar to the prior examples. In this case an iridium crucible 75 mm in diameter and 75 mm high was used with an upper insulating sleeve measuring 100 mm diameter and 100 mm high. An intimate mixture comprised of 1070.0 g lanthanum oxide, 9.2 g neodymium oxide and 620.7 g gallium oxide was introduced to the crucible. All reagents were 99.99% purity. The component oxides are purchased as free flowing microcrystalline solid powders in a size range of approximately 1-10 μm. Power to the iridium crucible was increased until the contents were completely molten. A seed of lanthanum orthogallate oriented with its [001] axis parallel to the withdrawal direction was brought into contact with the melt. Growth was initiated by withdrawing the seed at 1.25 mm per hour while rotating at 30 rpm. When the crystal attained a length of 100 mm at 25 mm diameter, it was extracted from the melt and cooled. The crystal was processed by end cutting, optical examination, and core drilling of a 5×50 mm cylindrical laser rod. The rod, when finished optically to laser specifications, AR coated, and subjected to active laser testing, functions as an active laser.

A laser rod formed from the Nd-doped boule of lanthanum orthogallate meets the optical requirements of the laser rods of the present invention and will have a wavefront distortion of less than ⅛ per cm length at a wavelength of 1.064 μm and an optical loss of less than 0.005 per cm length.

EXAMPLE IV

(Formation of Laser Crystal)

In order to prepare a laser crystal of composition La$_{0.99}$Nd$_{0.01}$GaO$_3$ where 1% of the La$^{3+}$ sites are coupled by Nd$^{3+}$, the following procedure is followed. A powdered mixture of La$_2$O$_3$, Nd$_2$O$_3$ and Ga$_2$O$_3$ is prepared in the molar ratio of 0.99:0.01:1.00 respectively. The component oxides are purchased as free flowing microcrystalline solid powders in a size range of approximately 1-10 μm. This powdered mixture is melted in the same manner as pure LaGaO$_3$. A single crystal is then grown from the melt. An oriented seed crystal of LaGaO$_3$ can be used to control the orientation of the boule and laser rod. The amount of the impurity ion (Nd$^{3+}$) in the crystal will, in general, not be exactly equal to that formulated in the melt. The amount is governed by the segregation coefficient k defined by the relation $k = c_s/C_L$, where $c_s$ in the Nd solid concentration and $C_L$ is the liquid concentration. Values of k larger than unity are to be expected because the $La^{3+}$ has an ionic radius larger than the other rare earths.

As is evident from the foregoing, various modifications can be made without departing from the spirit of the invention. It is not intended to limit the invention to the details heretofore recited, the invention being defined in the claims which follow.

We claim:

1. A laser rod composed of monocrystalline lanthanum orthogallate grown from a pure melt along a predetermined crystallographic direction and doped with an impurity ion that functions as a laser activator, said laser rod having a wavefront distortion $< \frac{1}{8} \lambda$ per cm length at the lasing wavelength ($\lambda$) and an optical loss $<0.005$ per cm length.

2. The doped monocrystalline lanthanum gallate of claim 1 wherein the impurity ion that functions as a laser activator is selected from the group consiting of rare earth series elements, first transition series elements, actinide series elements and mixtures thereof.

3. The doped monocrystalline lanthanum orthogallate of claim 1 wherein the said crystallographic direction has an orientation of [001], [010] or [100].

4. The doped monocrystalline lanthanum orthogallate of claim 1 wherein said crystallographic direction has an orientation of [010].

5. The doped monocrystalline lanthanum orthogallate of claim 1 wherein said crystallographic direction has an orientation of [001].

6. The doped monocrystalline lanthanum orthogallate of claim 1 wherein said crystallographic direction has an orientation of [100].

7. The laser rod of claim 1, wherein said laser rod is at least one centimeter in diameter and 10 centimeters in length.

8. The doped monocrystalline lanthanum orthogallate of claim 2 wherein the impurity ion that functions as a laser activator comprises a rare earth series element selected from the group consisting of Nd, Er, Tm, Ho, Tb, Pr or mixtures thereof.

9. The doped monocrystalline lanthanum orthogallate of claim 2 wherein the impurity ion that functions as a laser activator comprises Nd.

10. The doped monocrystalline lanthanum orthogallate of claim 2 wherein the impurity ion that functions as a laser activator comprises a first transition series element selected from the group consisting of trivalent Cr, trivalent Ti or mixtures thereof.

11. The doped monocrystalline lantanum orthogallate of claim 2 wherein the impurity ion that functions as a laser activator comprises trivalent uranium.

12. The doped monocrystalline lanthanum orthogallate of claim 2 wherein the said crystallographic direction has an orientation of [001], [010] or [100].

13. The doped monocrystalline lanthanum orthogallate of claim 2 wherein said crystallographic direction has an orientation of [010].

14. The doped monocrystalline lanthanum orthogallate of claim 2 wherein said crystallographic direction has an orientation of [001].

15. The doped monocrystalline lanthanum orthogallate of claim 2 wherein said crystallographic direction has an orientation of [100].

16. The laser rod of claim 2, wherein said laser rod is at least one centimeter in diameter and 10 centimeters in length.

17. The monocrystalline lanthanum orthogallate of claim 8 wherein the rare earth series impurity ion that functions as a laser activator in said crystal is present in a ratio relative to lanthanum ion of from about 1:0 to about 1:500.

18. The doped monocrystalline lanthanum orthogallate of claim 8 wherein the rare earth series element is Nd and the Nd:La ratio in said crystal is from 1:0 to 1:500.

19. The doped monocrystalline lanthanum orthogallate of claim 8 wherein the rare earth series element is Nd and the Nd:La ratio in said crystal is from about 1:50 to about 1:200.

20. The doped monocrystalline orthogallate of claim 8 wherein the said crystallographic direction has an orientation of [001], [010] or 100].

21. The doped monocrystalline lanthanum orthogallate of claim 8 wherein said crystallographic direction has an orientation of [010].

22. The doped monocrystalline lanthanum orthogallate of claim 8 wherein said crystallographic direction is an orientation of [001].

23. The doped monocrystalline lanthanum orthogallate of claim 8 wherein said crystallographic direction has an orientation of [100].

24. The laser rod of claim 8, wherein said laser rod is at least one centimeter in diameter and 10 centimeters in length.

25. The doped monocrystalline lanthanum orthogallate of claim 9 wheren said crystallographic direction has an orientation of [001], [010] or [100].

26. The doped monocrystalline lanthanum orthogallate of claim 9 wherein said crystallographic direction has an orientation of [010].

27. The doped monocrystalline lanthanum orthogallate of claim 9 wherein said crystallographic direction has an orientation of [001].

28. The doped monocrystalline lanthanum orthogallate of claim 9 wherein said crystallographic direction has an orientation of [001].

29. The laser rod of claim 9, wherein said laser rod is at least one centimeter in diameter and 10 centimeters in length.

30. The monocrystalline lanthanum orthogallate of claim 10 wherein the trivalent transition element impurity that functions as a laser activator in said crystal is present in a ratio relative to gallium ions from 1:100 to 1:500.

31. The doped monocrystalline lanthanum orthogallate of claim 10 wherein said crystallographic direction has an orientation of [001], [010] or [100].

32. The doped monocrystalline lanthanum orthogallate of claim 10 wherein said crystallographic direction has an orientation of [010].

33. The doped monocrystalline lanthanum orthogallate of claim 10 wherein said crystallographic direction has an orientation of [001].

34. The doped monocrystalline lanthanum orthogallate of claim 10 wherein said crystallographic direction has an orientation of [100].

35. The laser rod of claim 10, wherein said laser rod is at least one centimeter in diameter and 10 centimeters in length.

36. The doped monocrystalline lanthanum orthogallate of claim 11 wherein said crystallographic direction has an orientation of [001], [010] or [100].

37. The doped monocrystalline lanthanum orthogallate of claim 11 wherein said crystallographic direction has an orientation of [010].

38. The doped monocrystalline lanthanum orthogallate of claim 11 wherein said crystallographic direction has an orientation of [001].

39. The doped monocrystalline lanthanum orthogallate of claim 11 wherein said crystallographic direction has an orientation of [100].

40. The laser rod of claim 11, wherein said laser rod is at least one centimeter in diameter and 10 centimeters in length.

41. The monocrystalline lanthanum orthogallate of claim 17 wherein the ratio of rare earth series impurity ion to lanthanum ion in said crystal is from about 1:50 to about 1:200.

42. The doped monocrystalline lanthanum orthogallate of claim 17 wherein said crystallographic direction has an orientation of [001], [010] or [100].

43. The doped monocrystalline lanthanum orthogallate of claim 17 wherein said crystallographic direction has an orientation of [010].

44. The doped monocrystalline lanthanum orthogallate of claim 17 wherein said crystallographic direction has an orientation of [001].

45. The doped monocrystalline lanthanum orthogallate of claim 17 wherein said crystallographic direction has an orientation of [100].

46. The laser rod of claim 17, wherein said laser rod is at least one centimeter in diameter and 10 centimeters in length.

47. The doped monocrystalline lanthanum orthogallate of claim 41 wherein said crystallographic direction has an orientation of [001], [010] or [100].

48. The doped monocrystalline lanthanum orthogallate of claim 41 wherein said crystallographic direction has an orientation of [010].

49. The doped monocrystalline lanthanum orthogallate of claim 41 wherein said crystallographic direction has an orientation of [001].

50. The doped monocrystalline lanthanum orthogallate of claim 41 wherein said crystallographic direction has an orientation of [100].

51. The laser rod of claim 41, wherein said laser rod is at least one centimeter in diameter and 10 centimeters in length.

52. The monocrystalline lanthanum orthogallate of claim 30 wherein the ratio of transition element impurity ion to gallium ion in said crystal is from about 1:100 to about 1:500.

53. The doped monocrystalline lanthanum of claim 30 wherein said crystallographic direction has an orientation of [001], [010] or [100].

54. The doped monocrystalline lanthanum orthogallate of claim 30 wherein said crystallographic direction has an orientation of [010].

55. The doped monocrystalline lanthanum of claim 30 wherein said crystallographic direction has an orientation of [001].

56. The doped monocrystalline lanthanum orthogallate of claim 30 wherein said crystallographic direction has an orientation of [100].

57. The doped monocrystalline lanthanum orthogallate of claim 52 wherein said crystallographic direction has an orientation of [001], [010] or [100].

58. The doped monocrystalline lanthanum orthogallate of claim 52 wherein said crystallographic direction has an orientation of [010].

59. The doped monocrystalline lanthanum orthogallate of claim 52 wherein said crystallographic direction has an orientation of [001].

60. The doped monocrystalline lanthanum orthogallate of claim 52 wherein said crystallographic direction has an orientation of [100].

61. The doped monocrystalline lanthanum orthogallate of claim 18 wherein said crystallographic direction has an orientation of [001], [010] or [100].

62. The doped monocrystalline lanthanum orthogallate of claim 18 wherein said crystallographic direction has an orientation of [010].

63. The doped monocrystalline lanthanum orthogallate of claim 18 wherein said crystallographic direction has an orientation of [001].

64. The doped monocrystalline lanthanum orthogallate of claim 18 wherein said crystallographic direction has an orientation of [100].

65. The doped monocrystalline lanthanum orthogallate of claim 19 wherein said crystallographic direction has an orientation of [001], [010] or [100].

66. The doped monocrystalline lanthanum orthogallate of claim 19 wherein said crystallographic direction has an orientation of [010].

67. The doped monocrystalline lanthanum orthogallate of claim 19 wherein said crystallographic direction has an orientation of [001].

68. The doped monocrystalline lanthanum orthogallate of claim 19 wherein said crystallographic direction has an orientation of [100].

69. The doped monocrystalline lanthanum orthogallate of claims 1, 2, 8, 9, 10, 11, 17, 41, 30, 52, 18 or 19 wherein said crystallographic direction has an orientation chosen to minimize thermal effects on the laser rod during active lasing.

70. A boule of monocrystalline lanthanum orthogallate grown from a pure melt along a predetermined crystallographic direction and doped with an impurity ion that functions as a laser activator, said doped lanthanum orthogallate having a wavefront distortion $<\frac{1}{8}\lambda$ per cm length at the lasing wavelength ($\lambda$) and an optical loss $<0.005$ per cm length.

71. The boule of claim 70, wherein said boule is about 0.7 inch diameter or greater and about 4 inches in length or greater.

* * * * *